United States Patent [19]
Kaiser

[11] Patent Number: 4,934,679
[45] Date of Patent: Jun. 19, 1990

[54] POSITIONAL FIXATION ELEMENT FOR STRUCTURAL COMPONENTS

[75] Inventor: Harry Kaiser, Markgroningen, Fed. Rep. of Germany

[73] Assignee: Robert Bosch GmbH, Stuttgart, Fed. Rep. of Germany

[21] Appl. No.: 236,888

[22] Filed: Aug. 26, 1988

[30] Foreign Application Priority Data

Sep. 9, 1987 [DE] Fed. Rep. of Germany ....... 3730203

[51] Int. Cl.⁵ ............................................. B23Q 3/00
[52] U.S. Cl. ..................................... 269/305; 269/900
[58] Field of Search ............... 269/303, 304, 305, 306, 269/315, 903; 72/325

[56] References Cited

U.S. PATENT DOCUMENTS 3,753,364  1/1973  Runyon ................................. 72/325
4,072,378  2/1978  Lochbrunner et al. .
4,593,804  6/1986  Kinsey et al. ...................... 269/900

FOREIGN PATENT DOCUMENTS 3516489  11/1986  Fed. Rep. of Germany .

Primary Examiner—Judy Hartman
Attorney, Agent, or Firm—Edwin E. Greigg

[57] ABSTRACT

A positional fixation element is located on a first structural component and positionally fixes a second structural component, which is to be joined to the first component at a predetermined orientation relative thereto. The positional fixation element is substantially in the form of a stud, which protrudes beyond a reference plane of the first component. The positional fixation element is produced by means of a mandrel-like tool, which is pressed into the first component on an incline relative to the reference plane. In the process, material is displaced, so that on the one hand a groove-like indentation is formed, and on the other hand, an accumulation of material having a shape corresponding to that of the positional fixation element is created above the reference plane. The positional fixation element is suitable for positionally fixing electrical circuits, for example, or other components when glued or soldered onto the first component.

10 Claims, 1 Drawing Sheet

POSITIONAL FIXATION ELEMENT FOR STRUCTURAL COMPONENTS

BACKGROUND OF THE INVENTION

The invention relates to a positional fixation element as defined hereinafter and to a method for producing the positional fixation element. German Offenlegungsschrift 35 16 489 discloses a first structural component, which is flat in the middle, having positional fixation elements for securing a second structural component relative to the first component. The positional fixation elements are embodied as cylindrical protrusions, which protrude upwardly out of a reference plane of the first component. The protrusions may for example engage apertures in the second component. The second component may for example be power semiconductors or other electrical circuits. The protrusions are produced by means of an upsetting tool, which may be embodied similarly to a punching die and is pressed into the back side of the first component. To avoid breaking the die, its diameter should be greater than the thickness of the first component. This has the disadvantage that if the first component is very thick, very great forces must be exerted during the upsetting operation in order to press the tool into the metal. Moreover, in cases in which the second component lacks a centering hole and therefore must be installed in between a plurality of protrusions, there is a disadvantage that because of the large amount of space required by the protrusions, they are difficult to accommodate; or else the first component must even be made larger, with the disadvantage of making the entire unit larger in size.

OBJECT AND SUMMARY OF THE INVENTION

The positional fixation element defined herein has an advantage that in a space-saving manner, it can be made small in size, for structural reasons, no matter how thick the first component, may be; for example, the first component may be a base plate of a measuring apparatus, or may have to dissipate great quantities of heat. The definitive characteristics denoted hereinafter enable economical manufacture of the positional fixation element and lessen the danger of tool breakage.

The definitive characteristics narrated herein define specific exemplary embodiments that can be produced by means of simple tools. These tools can be embodied simply, in such a way that tool breakage is very unlikely.

The invention will be better understood and further objects and advantages thereof will become more apparent from the ensuing detailed description of a preferred embodiment taken in conjunction with the drawings.

DESCRIPTION OF THE PREFERRED EMBODIMENT

Figure 1:
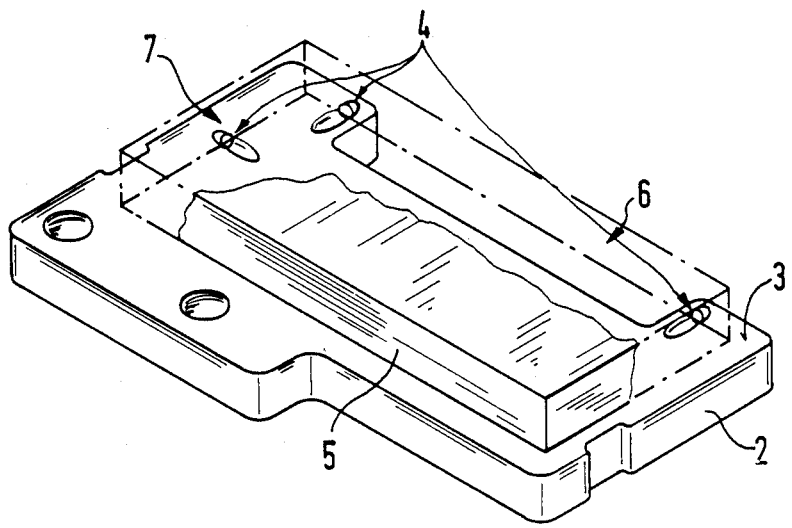
FIG. 1 is a perspective view of a first structural component having positional fixation elements onto which is positioned a second structural component.

A first structural component 2 shown in FIG. 1 has a flat surface 3, located in an imaginary reference plane. The first component 2 shown is relatively thick and has positional fixation elements 4, for example three of them formed in one surface. These three positional fixation elements 4 serve to position a second structural component 5, which has at least two stop faces 6 and 7, relative to the first component. The second component 5 may for example be a power semiconductor of the type mentioned in German Offenlegungsschrift 35 16 489, or a plate slab having discrete and/or integrated circuit components. However, the second component 5 need not be an electric or electric component but may be of any arbitrary kind.

Figure 2:
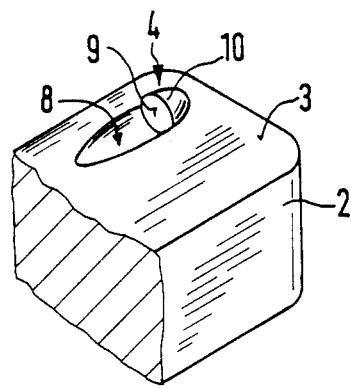
FIG. 2 is an enlarged view of a portion of the first structural component.

The positional fixation element 4 shown on a larger scale in FIG. 2 comprises an accumulation of the material that comprises the body of the first component 2. This accumulation can be brought about by using a mandrel- or gouge-like tool, which during the coining operation is guided over a path of motion that for example is inclined relative to the surface 3 and is pressed into the body of the first component 2. The result is a groove-like indentation 8, which ultimately produces an upset element having a perpendicular front face 9. The volume of material removed from this groove-like indentation 8 below the surface reference plane located along the surface 3 of the first component 2 is then displaced in the direction of movement of the tool until it protrudes outwardly beyond the aforementioned reference plane, in the form of a substantially stud-like positional fixation element 4. The positional fixation element 4 is like an arrested metal-cut chip that has stopped moving. At the point engaged by the tool, the positional fixation element 4 has a limiting face 9 perpendicular to the surface. In the exemplary embodiment shown in FIG. 1, the part of the limiting face 9 that protrudes beyond the aforementioned reference plane serves as a stop face for the perpendicular, end and side stop faces 6 and 7 of the second component.

The positional fixation elements may be formed by a tool having one or more gouge-like tools such that one or more positional fixation elements may be made at the same time.

Although it has been stated above that the positional fixation element is embodied as substantially stud-like, the limiting face 9 need not necessarily be used for positionally fixing a second component 2. On the contrary; any other face 10 which protrudes sufficiently steeply with respect to the surface 3 can be used for positionally fixing components of any kind. If a suitably shaped tool is used, stud-like positional fixation elements are obtained that are adequate replacements for the cylindrical protrusions previously disclosed in German Offenlegungsschrift 35 16 489, to give one example. This is for instance possible if the second component 5 is sufficiently well secured on the first component 2 by other fastening means. This can be done by disposing an adhesive composition or a soldering composition, for instance, between the two components 2 and 5. Hence it will be appreciated that the positional fixation elements 4 can for example serve as aids in aligning structural components while the components are being joined to one another. Because even slight forces are sufficient for positional fixation in that case, the strength of even relatively small stud-like positional fixation elements 4 of the kind according to the invention will be entirely adequate. Naturally, materials that are suitable for producing extruded parts, for instance, will be quite suitable for producing these positional fixation elements as well. In the event that the first component, having the positional fixation elements 4, is to be made of aluminum, then it can be advantageously made from a wrought alloy.

The foregoing relates to a preferred exemplary embodiment of the invention, it being understood that other variants and embodiments thereof are possible within the spirit and scope of the invention, the latter being defined by the appended claims.

What is claimed and desired to be secured by Letters patent of the United States is:

1. A combination of a first and at least one second structural component, wherein said first structural component comprises:

at least one flat surface;

at least one upstanding fixation element formed in said at least one flat surface; and said at least one upstanding fixation element being at one end of a groove-like indentation formed from a compressed accumulation of material of said flat surface derived from said groove-like indentation formed on an incline along and below said at least one flat surface, said at least one upstanding fixation element has an annular facial portion perpendicular to a longitudinal axis of said groove-like indentation and said at least one flat surface, and said annular facial portion protrudes above said at least one flat surface, and said at least one second structural component comprises:

at least one flat surface faced toward said at least one flat surface of said first structural component; and at least one additional surface faced toward said upstanding fixation element.

2. A first structural component as defined by claim 1, in which the accumulation of material is a chip-like formation, which is shaped by means of a mandrel-like tool.

3. A first structural component as defined by claim 1, in which said accumulation of material is a chip-like entity, which can be produced in the manner of a gouge.

4. A first structural component as set forth in claim 1, in which said at least one flat surface includes more than one upstanding fixation element.

5. A first structural component as set forth in claim 4, in which said upstanding fixation elements are positioned to support a second structural component.

6. A method for forming an upstanding fixation element on a flat surface of a first structural component having a reference plane along said flat surface which comprises:

advancing an upsetting tool along a path of motion which is inclined at an angle relative to said reference plane, said upsetting tool having a front face oriented substantially perpendicularly to said path of motion and forcing material of said first structural component ahead of said upsetting tool to form a groove-like indentation on an incline along and below said flat surface and to compress and accumulate material above said flat surface to form an annular facial surface perpendicular to a longitudinal axis of said groove-like indentation and to said flat surface with a portion of said compressed and accumulated material extending outwardly of the reference plane and said groove-like indentation in said flat surface preceding said outward portion of material thereby forming an upstanding fixation element at one end of said groove-like indentation.

7. A method as set forth in claim 6, which comprises: forming more than one upstanding fixation element at the same time.

8. A positional fixation component, which comprises:

an upper flat surface on which a bottom surface of a second component is to be placed;

at least one upstanding fixation element formed in said upper flat surface;

said at least one upstanding fixation element located at one end of a groove-like indentation and formed by material of said upper flat surface obtained by forming said groove-like indentation on an incline along and below said upper flat surface, said at least one upstanding fixation element has an annular facial portion perpendicular to a longitudinal axis of said groove-like indentation and said upper flat surface, and said annular facial portion extends upwardly from said groove-like indentation and protrudes above said upper flat surface.

9. A positional fixation component as defined by claim 1, in which said at least one upstanding fixation element is a chip-like formation formed by a portion of said upper flat surface.

10. A first structural component as set forth in claim 1, in which said upper flat surface includes more than one upstanding fixation element with said facial portion parallel with an end surface of said component which end surface is perpendicular to said upper flat surface.

* * * * *